United States Patent [19]

Savelainen

[11] Patent Number: 4,712,068

[45] Date of Patent: Dec. 8, 1987

[54] RF COIL ARRANGEMENT FOR NMR EXAMINATION APPARATUS

[75] Inventor: Matti Savelainen, Espoo, Finland

[73] Assignee: Instrumentarium Corp., Finland

[21] Appl. No.: 628,478

[22] Filed: Jul. 6, 1984

[30] Foreign Application Priority Data

Jul. 7, 1983 [FI] Finland ............................... 832499

[51] Int. Cl.⁴ .......................................... G01R 33/20
[52] U.S. Cl. .................................... 324/318; 335/299
[58] Field of Search ............... 336/189, 190, 191, 225; 324/300, 307, 318, 319, 320, 315, 316; 335/299; 343/896; 333/219–221, 227, 231, 235, 242

[56] References Cited

U.S. PATENT DOCUMENTS

| | | | |
|---|---|---|---|
| 1,999,258 | 7/1933 | Roberts | 336/191 |
| 2,267,613 | 11/1941 | Lindenblad | 343/896 |
| 2,306,693 | 12/1942 | Gloss | 336/189 |
| 2,774,967 | 12/1956 | Lundburg | 343/896 |
| 4,398,149 | 8/1983 | Zens | 324/319 |
| 4,439,733 | 3/1984 | Hinshaw | 324/318 |
| 4,506,224 | 3/1985 | Krause | 324/319 |
| 4,507,628 | 3/1985 | Kameya | 336/225 |
| 4,542,343 | 9/1985 | Brown | 324/307 |
| 4,621,237 | 11/1986 | Timms | 324/322 |

FOREIGN PATENT DOCUMENTS

| | | | |
|---|---|---|---|
| 0047065 | 3/1982 | European Pat. Off. | 324/318 |
| 2404100 | 9/1974 | Fed. Rep. of Germany | 324/318 |

OTHER PUBLICATIONS

Nucler Magnetic Resonance Imaging in Medicine: Kaufman, 1981, pp. 62–65.

Primary Examiner—Michael J. Tokar
Assistant Examiner—Scott M. Oldham
Attorney, Agent, or Firm—Andrus, Sceales, Starke & Sawall

[57] ABSTRACT

The invention relates to an RF (=radio frequency) coil arrangement for an NMR examination apparatus, an object or target to be examined, e.g. a patient or part of a patient being adapted to be placed inside said coil arrangement which is adapted to excite the nuclei of a selected target area by transmitting an RF pulse substantially orthogonal to a homogeneous basic magnetic field produced by the apparatus and, thereafter, to receive and detect an NMR signal generated in the target. In order to eliminate the drawbacks of a so-called saddle coil conventionally used as an RF coil the invention is characterized in that it comprises a transfer line, continuous and wired in a manner that its various parts induce an RF field of different direction. Both in excitation and detection of signals, said transfer line can be adapted to process a magnetic field rotating in just one direction and it can be connected as an endless loop. Especially if a plurality of rounds are desired on an RF coil, a preferably and technically readily designable construction can be achieved by entwining the transfer line into a mesh shaped e.g. as a cylinder or a like body of revolution.

11 Claims, 25 Drawing Figures

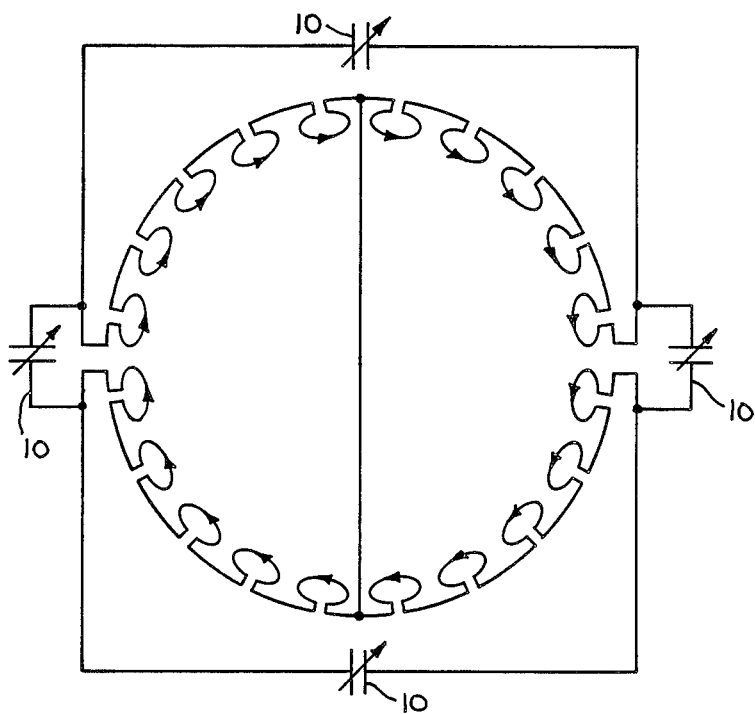
FIG. 3a
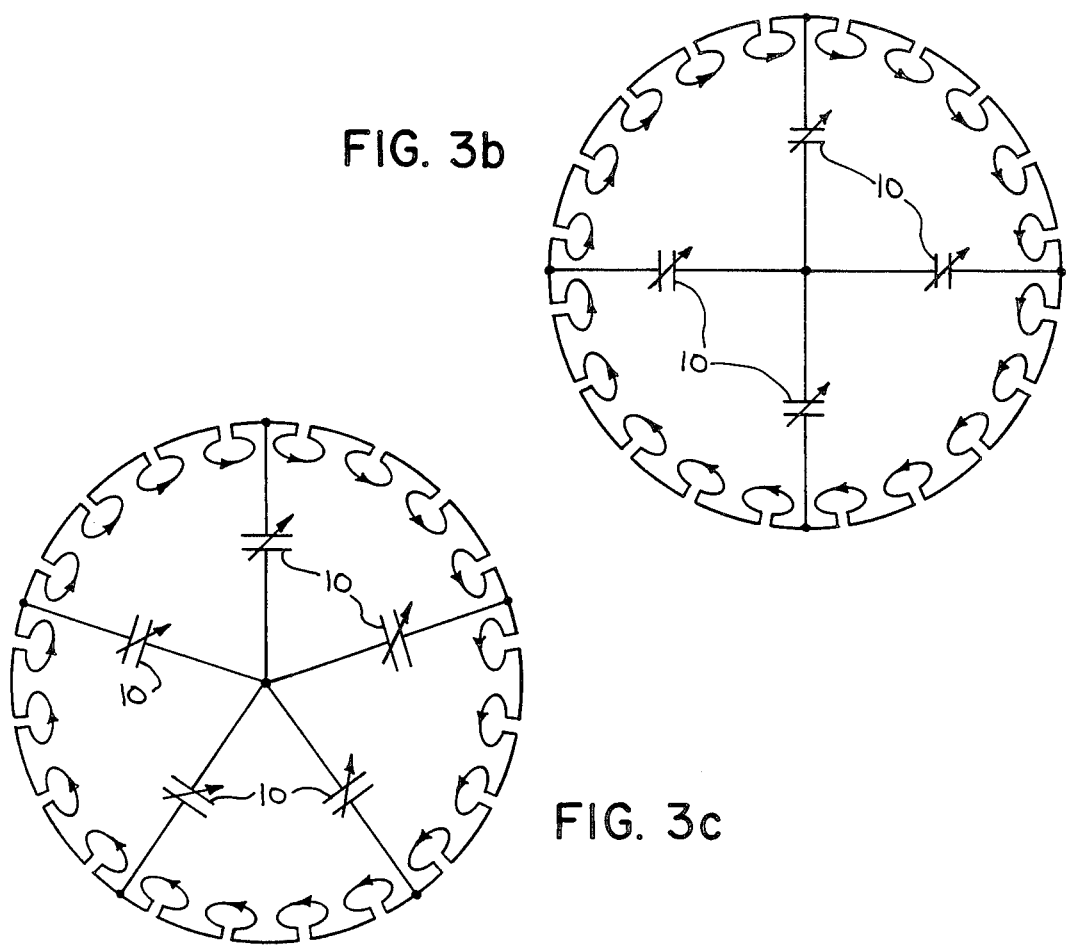
FIG. 3b
FIG. 3c

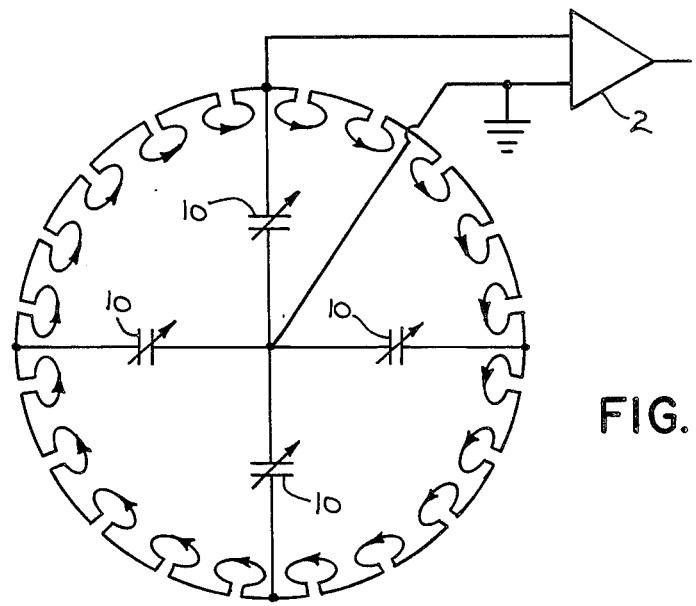
FIG. 4e
FIG. 4f
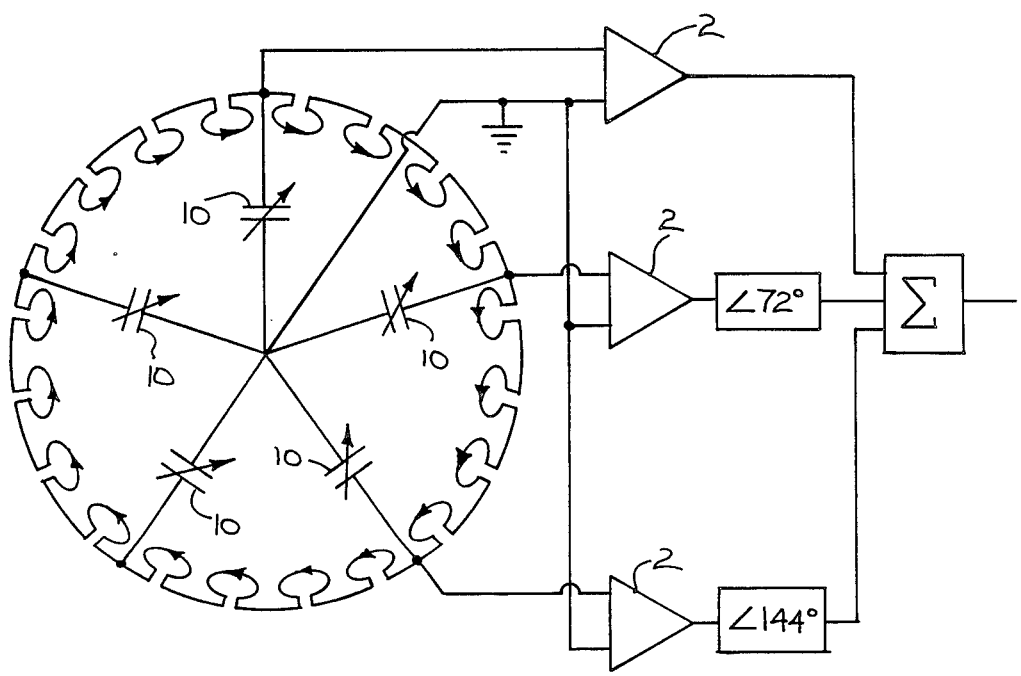

RF COIL ARRANGEMENT FOR NMR EXAMINATION APPARATUS

BACKGROUND OF THE INVENTION

The present invention relates to an RF (=radio frequency) coil arrangement for an NMR examination apparatus, an object or target to be examined, e.g. a human body or some area of interest of a human body, being adapted to be placed inside said coil arrangement which is adapted to excite the nuclei of a selected target area by transmitting an RF field pulse substantially orthogonal to a homogeneous basic magnetic field produced by the apparatus and, thereafter, to receive and detect an NMR signal emitted by the nuclei in the target area.

It is well-known in the prior art that an NMR examination and imaging apparatus requires an RF coil, which on one hand transmits to a target a radio frequency pulse and thus exites a certain selected area of a target for mapping and, on the other hand, receives an electromagnetic field induced by nuclei precessing in said area, i.e. an NMR signal. These actions can be effected by means of a single RF coil or by using different coils for exciting and receiving. In so-called whole-body NNR mappings, in which one or a plurality of slices are imaged from e.g. the head or thorax of a patient, a homogeneous basic magnetic field is generally produced by means of solenoid coils with a patient pushed axially therein. A solenoid type of coil would in principle make also an excellent RF coil but in the present case it cannot be used since the field of an RF coil would then be parallel to the homogeneous basic magnetic field and deflection of nuclei from the direction of a basic magnetic field is not possible. For this reason, an RF coil must be provided by some other type of coil arrangement. In most commonly known equipment, use is made of a so-called a saddle coil arrangement, whose properties, however, are not equal to those of a solenoid since its configuration is more spatially distributed and since, due to the length of a conductor, the energy of a magnetic field is mostly distributed not in a target area to be imaged but elsewhere.

In order to overcome the problem, the publication EP-71896 proposes a solution based on the use of two saddle coils. Thus, it is possible to choose a magnetic field rotating in just one direction and leading to certain advantages, described in more detail later. However, the question is still about a saddle coil, whose other drawbacks are not eliminated by said solution. On the other hand, the publication EP-73375 discloses a solution that does not require saddle coils and likewise provides a possibility of detecting just one of the rotating directions. A weakness in this prior art solution is that it requires the use of an RF field-reflecting cylinder, which complicates the apparatus and adds to the costs.

SUMMARY OF THE INVENTION

An object of the invention is to create a novel RF coil configuration, having improved properties and being particularly well suited for use in said-whole body mapping equipment with solenoid type magnets but which can be preferably applied also to some other type of imaging, e.g. as a surface coil for imaging the breast. Another object of the invention is to provide an RF coil from which the drawbacks of the prior art solutions have been eliminated.

These objects of the invention are achieved as set out in the claims by providing an RF coil arrangement in a manner that said arrangement comprises a continuously connected transfer or transmission line, wired so that its various points induce a differently directed RF field. The phase differences created in the transfer line facilitate the maximal connection of a rotating RF field of a coil. The transfer line is further connected as an endless loop. Furthermore, the transfer line can be preferably entwined into a mesh which, depending on a target to be examined, can be designed as a cylindrical or conical jacket, to be fitted around a target and having its axis at least substantially parallel to the basic field.

An RF coil arrangement of the invention, by utilizing said phase differences in a manner that being connected to various points of a coil arrangement and by combining the detected signals with a suitable phase difference to each other, will be capable of measuring a field rotating in just one direction. For this reason, a coil arrangement of the invention is better than a conventional saddle coil as it is possible to collect 50% more of a signal, thus improving the signal-to-noise ratio. In addition, a coil of the invention is technically easy to design, if a plurality of turns are desired on an RF coil, whereby it is possible to employ lower operating frequencies and to collect more of a signal. Although a plurality of turns are mounted on a coil, various turns can be wound on different locations, the eddy currents impairing the quality (Q-factor) of a coil as well as the undesired phase differences remaining minor unlike in a saddle coil.

BRIEF DESCRIPTION OF THE DRAWINGS

The invention will now be described in more detail with reference made to the accompanying drawing, in which FIGS. 1a . . . 1h show the wiring principles of an RF coil of the invention.

DETAILED DESCRIPTION OF THE PREFERRED EMBODIMENT

FIGS. 1a–1h show simplified RF coil constructions of the invention, in which a coil 1 is wound on the surface of a cylindrical body. This body must be made of an electrically non-conducting low-dissipation material, e.g. fiberglass-reinforced epoxy. In FIGS. 1b, 1d, 1f and 1h the cylinder surface is spread out, so that the twining principles of an RF coil can be more readily understood. Let us examine more closely the case shown in FIGS. 1g and 1h, wherein n rounds of wiring is wound around the cylinder in a manner that the wire alternately runs to the top and bottom edge of said cylinder. The position where the wire meets the edge shifts slightly lap by lap so as to wind n number of laps or rounds into an endless loop.

Figure 1A:
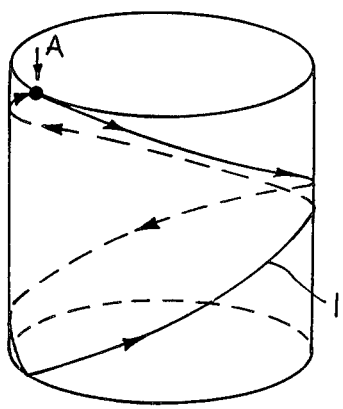
Figure 1B:
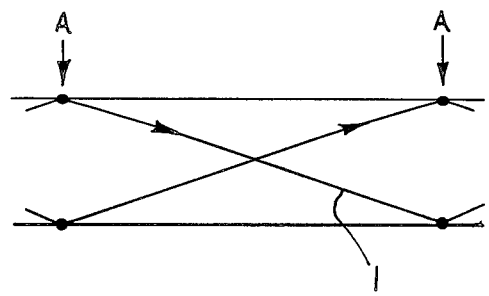
Figure 1C:
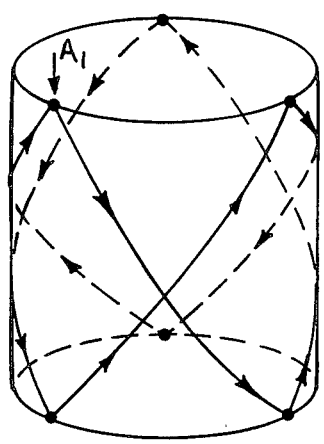
Figure 1D:
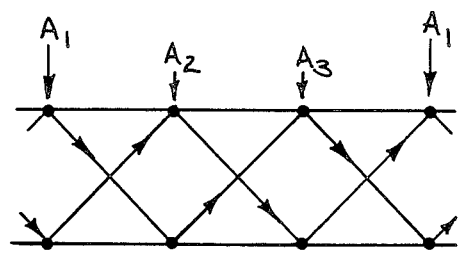
Figure 1E:
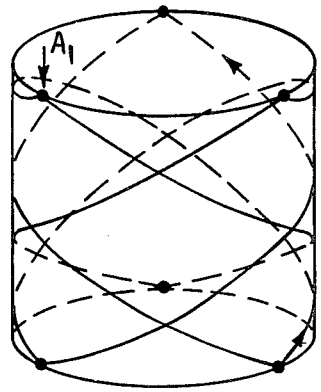
Figure 1F:
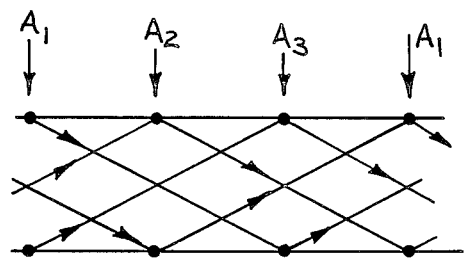
Figure 1G:
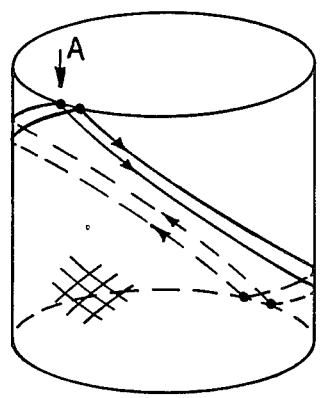
Figure 1H:
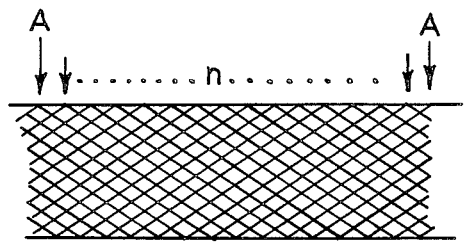
Figure 2A:
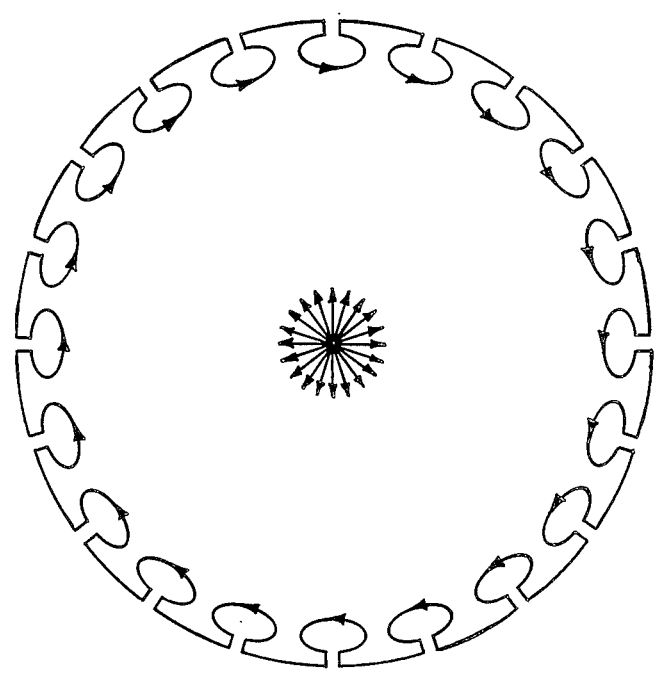
FIGS. 2a and 2b show in principle view a magnetic field produced by an RF coil according to FIGS. 1g and 1h, FIGS. 3a, 3b and 3c show alternative solutions for connecting an RF coil so that the resonance frequency of a resonance circuit can be adjusted as rotating, FIGS. 4a . . . 4f show alternative solutions for connecting an RF coil for receiving the NMR signals generated in a target to be examined or for inducing a rotating RF field.
Figure 2B:
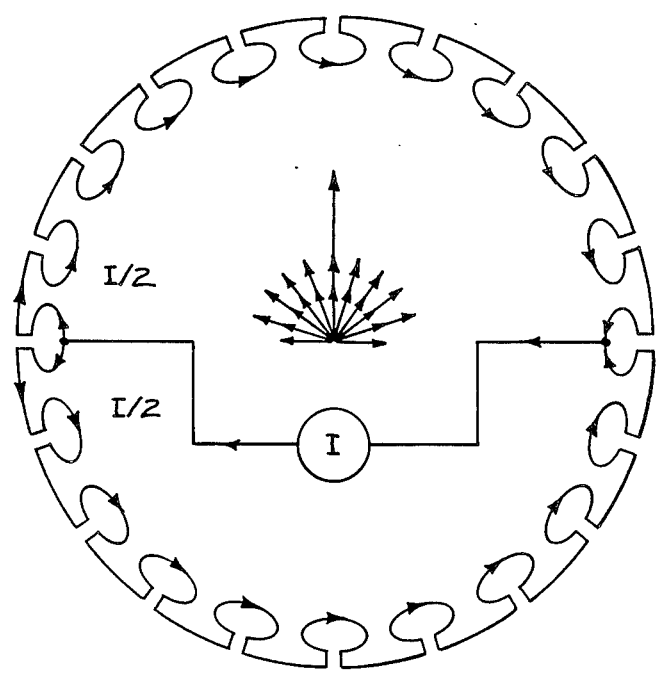

In FIGS. 2a and 2b the n loops of the construction shown in FIGS. 1g and 1h are presented as separate loops, so that a component produced by each loop orthogonal to the axis of a magnetic field points in the same direction that it would point also in the case of FIGS. 1g and 1h (in FIG. 2 n=20). Now, if these n loops suitably involve some capacitive connection in addition to inductance, a signal can be able to proceed in these n loops the same way as in a transfer line. If the wave length in this transfer line is equal to the total length of the n loops, it can be noted from FIG. 2b that a resultant field generated by the loops rotates while maintaining a constant amplitude. Accordingly, if we had a magnetic moment rotating in the center at a suitable velocity, a rotating signal will be induced in n loops. Each of the n loops is connected to a rotating source as well as possible since a signal is always at a proper phase.

Studied next will be a signal-to-noise ratio of signals achieved on one hand by a normal non-rotating signal arrangement and, on the other hand, of those achieved by a rotating coil arrangement of the invention. In a normal non-rotating case, induced in a coil is the voltage $U$, $U=(d\phi/dt)=\overline{K}\cdot(d\overline{M}/dt)$, wherein $\phi$ is an inducing flux, $\overline{K}$ a flux density of a current unit passing in the coil at a signal-emitting target, $\overline{M}$ a resultant magnetic moment possessed by a signal-emitting target, and t is time. If a signal is emitted by precessing nuclei, the result will be:

$$\overline{M} = M_o \sin(\omega t)\overline{i} + M_o \cos(\omega t)\overline{j} \quad (1)$$

wherein $\overline{i}$ and $\overline{j}$ are unit vectors orthogonal to the basic magnetic field and to each other (the directional vectors of x,y-coordinate axes). If $\overline{i}$ is parallel to the coil axis, the result will be:

$$U = \overline{K}\cdot(d\overline{M}_x/dt) = KM_o \omega \cos(\omega t). \quad (2)$$

If the coil is connected as a resonance circuit, the voltage U will induce in resonance into a circuit the current I:

$I=U/R$, wherein R is resistance of the circuit,
$R=\omega L/Q$, wherein L is inductance of the coil and Q is quality factor of the coil.

A power P delivered by precessing nuclei to the resonance circuit is:

$$P = \overline{B}_o \cdot \frac{d\overline{M}}{dt} = \overline{B}_o \cdot \gamma \overline{B}_i X \overline{M} \quad (3)$$

wherein $\gamma$ is the gyromagnetic ratio of a nucleus, $\overline{B}$ is a magnetic field produced in a target by the current passing in the coil, and $\overline{B}_o$ is a basic magnetic field. Since valid is:

$$B_o \gamma = \omega \quad (4)$$

and $$\overline{B}_i = K\overline{I}\overline{i} = K\frac{U}{R}\overline{i} = K\frac{UQ}{\omega L}\overline{i} = K^2 M_o \frac{\omega Q}{\omega L}\cos(\omega t)\overline{i} \quad (5)$$

obtained will be:

$$P = \omega M_y \cdot B_i = \omega M_o \frac{K^2}{L} M_o Q \cos^2(\omega t) = \frac{K^2}{L}\omega M_o^2 Q \cos^2(\omega t). \quad (6)$$

Obtained for the power root-mean-square value $\hat{P}$ is:

$$\hat{P} = \frac{1}{2}\frac{K^2}{L}\omega M_o^2 Q. \quad (7)$$

Calculated now will be a corresponding power delivered by nuclei with a rotating coil arrangement. A small part $\Delta$ of the coil arrangement is studied. Induced in this part is a voltage $$\Delta U = (d\Delta\phi/dt) = \Delta K(d\overline{M}/dt) = \Delta K\omega M_o \cos(\omega t), \quad (8)$$

If part $\Delta$ is in direction $\overline{i}$. The coil part $\Delta$ must also consume the power induced therein, so $$I = \Delta U/\Delta R = \frac{\Delta K\omega M_o \cos(\omega t)}{\omega \Delta L} Q \quad (9)$$

wherein $\Delta L$ is the inductance of part $\Delta$. Since the coil provides a continuous transfer line, parts $\Delta$ of various directions will by turns receive their maximum current:

$$I_{Max} = \frac{\Delta K}{\Delta L} M_o Q \quad (10)$$

Accordingly, the different parts $\phi$ of a current must at each moment have $I(\phi)=I_{max}\cos(\omega t-\phi)$ depending on direction $\phi$. Thus, the currents of various components momentarily at moment 0 create in the middle of the coil arrangement a magnetic field in direction $\phi=0$:

$$B = \int_o^{2\pi} I_{Max} \cdot \cos(-\rho)K_\rho(\rho)d\rho, \quad (11)$$

wherein $K_\phi(\phi)$ is a field produced by a unit current in direction $\phi$ per angular unit in direction $\phi=0$:

$$K_\phi(\phi) = K_\phi(O)\cdot\cos\phi \quad (12)$$

Thus obtained will be:

$$B = \int_o^{2\pi} I_{Max}\cos(-\rho)K_\rho(O)\cos\rho = I_{Max}K_\rho(O)\cdot\pi. \quad (13)$$

The direction of a field changes as time changes. Thus, the field rotates at a constant amplitude B and at frequency $\phi$ $$B = \frac{\Delta K}{\Delta L} K_\rho(O) \pi M_o Q \longrightarrow \quad (14)$$

$$\vec{B} = B(\cos(\omega t)\vec{i} - \sin(\omega t)\vec{j}) \tag{15}$$

The power delivered by nuclei into the resonance circuit is:

$$P = \vec{B}_o \cdot \frac{d\vec{M}}{dt} = \vec{B}_o \cdot \gamma \vec{B}_i X \vec{M} = \omega B M_o |(\cos(\omega t)\vec{i} - \sin(\omega t)\vec{j})X(\sin(\omega t)\vec{i} + \cos(\omega t)\vec{j})| = \omega M_o B(\cos^2(\omega t) + \sin^2(\omega t)) = \omega M_o B = \pi \frac{\Delta K}{\Delta L} K_\rho(O)\omega M_o^2 Q = \hat{P}. \tag{16}$$

Next studied will be the noise inducing in resonance circuits. Both in the case of a rotating and non-rotating field a noise power $P_n$ is the same $$\hat{P}_n = \hat{U}^2/R = 4kT\Delta f \tag{17}$$

wherein T is temperature, k a Boltzmann constant and $\Delta f$ a frequency band width to be analysed.

If a resultant signal is suitably measured in the coil arrangement of a rotating field, a result obtained may be a component rotating in just one direction. Since a signal to be measured only rotates in one direction, this mode of measuring does not cause any reduction in a signal but, instead, the noise power will be reduced to half. The ratio of signal power and noise power will be:

$$\left(\frac{\hat{P}_s}{\hat{P}_n}\right)_{\text{non-rotating}} = \tfrac{1}{2} \frac{K^2}{L} \omega M_o^2 Q \frac{1}{4kT\Delta f} \tag{18}$$

$$\left(\frac{\hat{P}_s}{\hat{P}_n}\right)_{\text{rotating}} = 2\pi \frac{\Delta K}{\Delta L} K_\rho(O) \omega M_o^2 Q \frac{1}{4kT\Delta f}. \tag{19}$$

In order to facilitate comparison, next examined will be a case where a coil arrangement of the invention is connected in a non-rotating fashion, as shown in FIG. 2b. A field produced by current I will be:

$$B = 2 \int_o^{\pi/2} \frac{I}{2}, K_\rho(O)\cos\rho d\rho = 2K_\rho(O) \cdot I, \text{ or} \tag{20}$$

$$K = 2K_\phi(O). \tag{21}$$

If the inductance per angular unit is $L_\phi$, the total inductance between two terminals will be $$L = \frac{2\pi L_\phi}{4} = \frac{\pi}{2} L_\phi \tag{22}$$

Resulting in:

$$\left(\frac{\hat{P}_s}{\hat{P}_n}\right)_{\text{non-rotating}} = \tfrac{1}{2} \frac{4K_\rho^2(O)}{\frac{\pi}{2} L_\rho} \omega M_o^2 Q \frac{1}{4kT\Delta f} = \frac{4}{\pi} \frac{K_\rho^2(O)}{L_\rho} \omega M_o^2 Q \frac{1}{4kT\Delta f} \tag{23}$$

-continued $$\left(\frac{\hat{P}_s}{\hat{P}_n}\right)_{\text{rotating}} = 2\pi \frac{K_\rho^2(O)}{L_\rho} \omega M_o^2 Q \frac{1}{4kT\Delta f}, \tag{24}$$

i.e. by circuiting a coil arrangement in a manner to facilitate rotation of a field and by only measuring a field rotating in the proper direction, a single coil arrangement can be used to improve the signal-to-noise ratio up to $\pi^2/2$. Most readily measurable from a rotating coil arrangement by means of a non-rotating connection are quantities L and K, resulting in:

$$L_\phi = \frac{2L}{\pi} \text{ and } K_\phi(O) = \frac{K}{2} \tag{25}$$

Calculated on these quantities the result will be:

$$\left(\frac{\hat{P}_s}{\hat{P}_n}\right)_{\text{rotating}} = 2\pi \frac{(K/2)}{2L/\pi} \frac{K}{2} \omega M_o^2 Q \frac{1}{4kT\Delta f} = \frac{\pi^2}{4} \frac{K^2}{L} \omega M_o^2 Q \frac{1}{4kT\Delta f} \tag{26}$$

this formula can be compared with formula (18) and again the improvement $\pi^2/2$ can be noted.

Figure 4A:
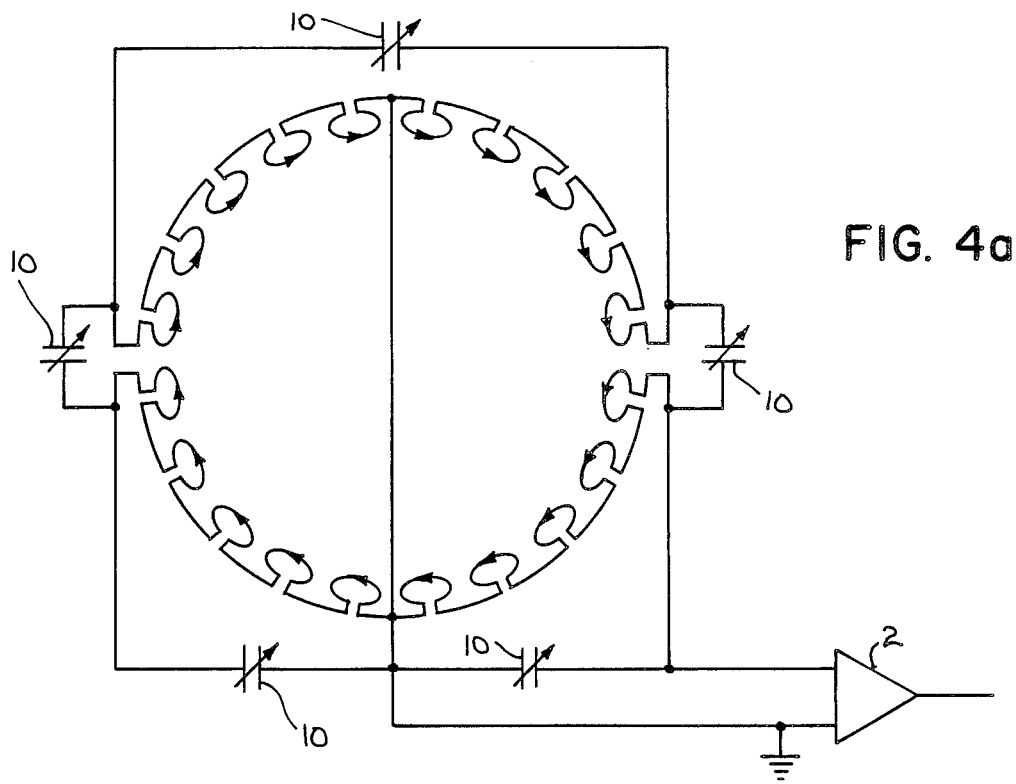
Figure 4B:
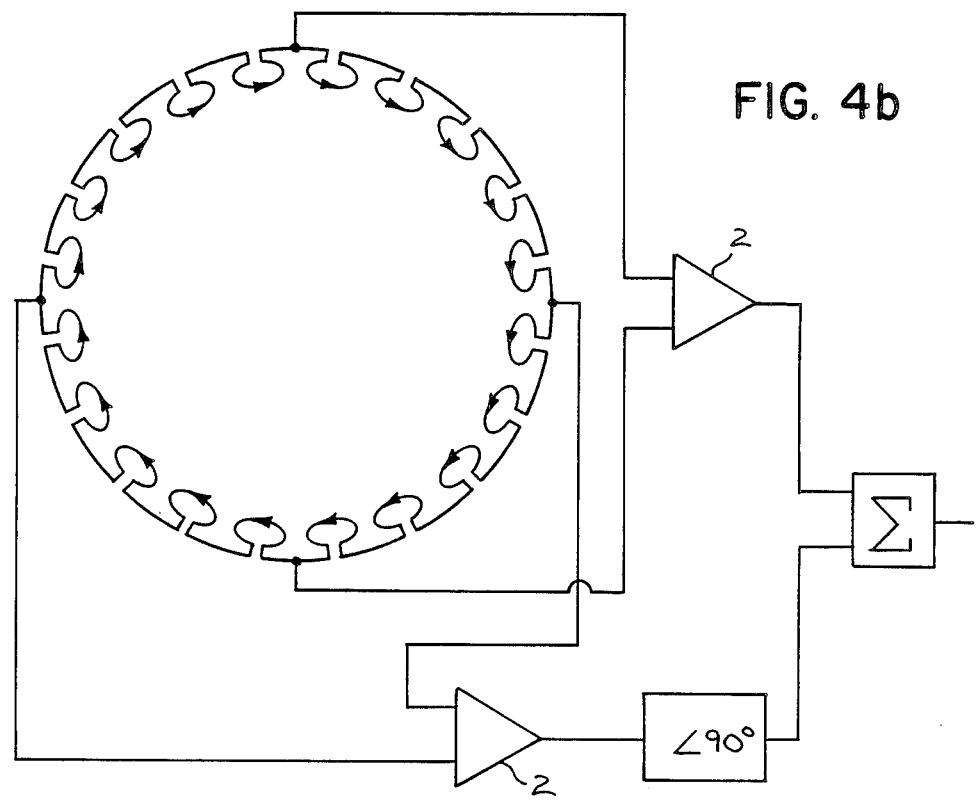
Figure 4C:
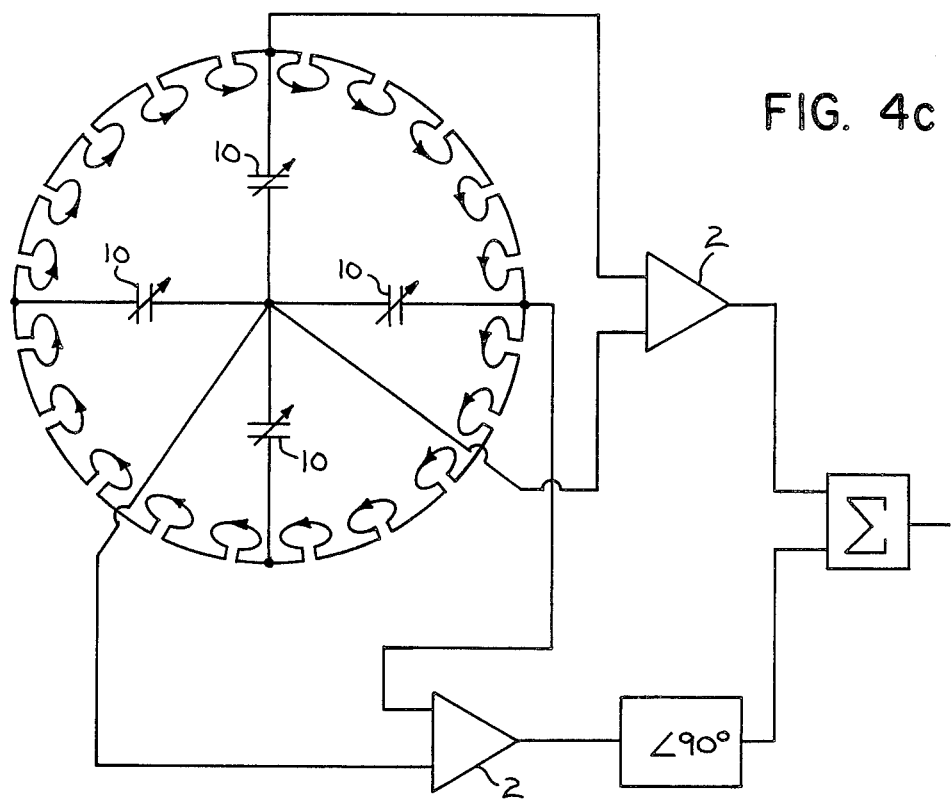
Figure 4D:
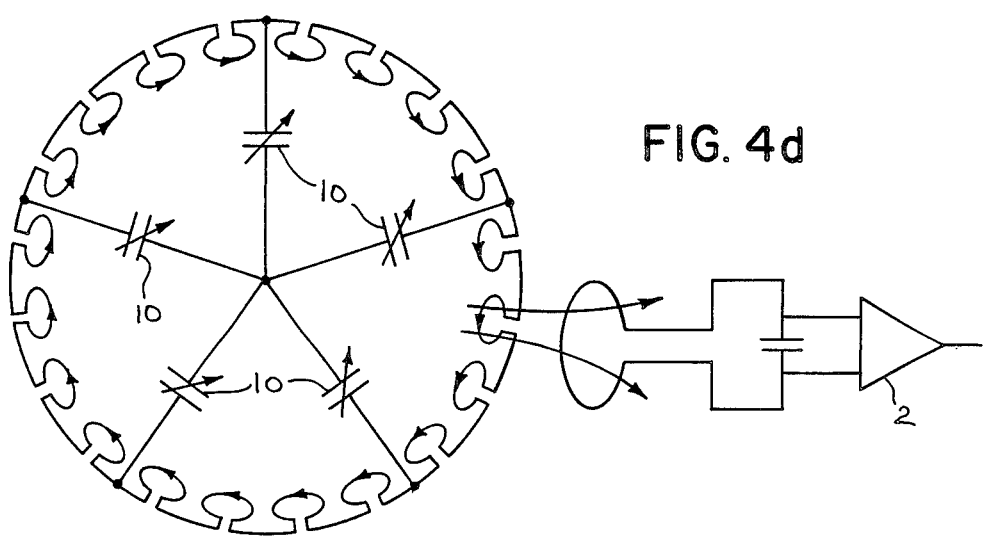

FIGS. 3a ... 3c disclose by way of example circuits for exciting a coil arrangement as rotating to a desired frequency. For example, the circuits shown in FIGS. 4a ... 4f a signal induced in a coil can in turn detected in rotating condition by adjusting capacitors 10 to proper values. In this case, the values of these capacitors substantially differ from each other. If the amplifers 2 shown in FIGS. 4a ... 4f are replaced by power sources, the circuits inducing a rotating RF field will be obtained. In the circuit shown in FIG. 4d, there is used an inductive connection between a coil coupled with the preamplifier and a coil arrangement of the invention.

Figure 5:
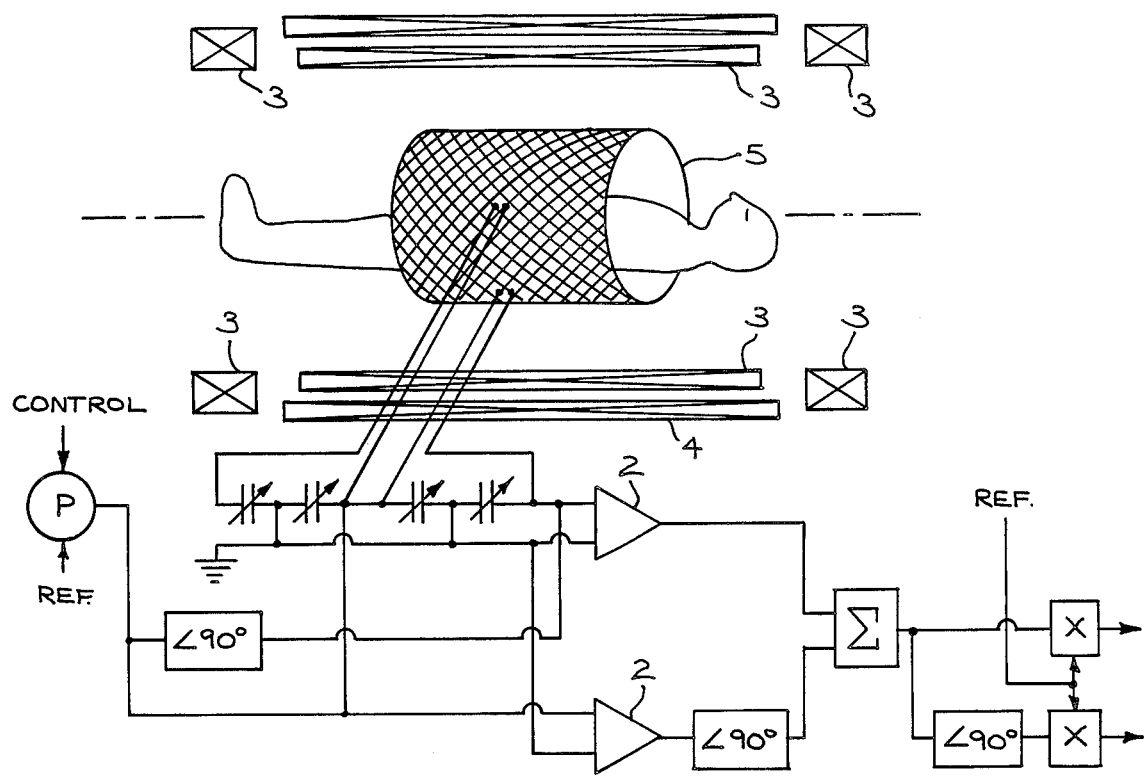
FIG. 5 is a principle view of one NMR examination apparatus in which an RF coil of the invention is applied.

FIG. 5 shows schematically an NMR examination apparatus which, by the application of a coil arrangement of the invention, can be used to effect NMR mapping of a human body or the like target. Magnetic coil sets 3 are used to generate a homogeneous basic magnetic field within the area of a target. Gradient coil sets 4 are used to vary the magnetic field so as to obtain desired location information. An RF coil 5 is used to transmit RF field pulses for deflecting nuclei and to receive an RF field induced by nuclei. Connections to a coil are made from two different directions by means of a circuit shown in FIG. 4c. One of the preamplified signals is subjected to 90° phase shift, followed by adding up the signals. The result obtained will be a signal for the field rotating in the other direction. The total obtained is divided into two parts differing by a 90° phase shift and these signals can be subjected to normal quadrature detection by using a reference signal. As for quadrature detection, reference is made to article: Journal of Magnetic Resonance 25, 559-562, (1977), A Simple Approach to Single-Channel Quadrature Detection, G. Bodenhausen et. al.

Figure 6:
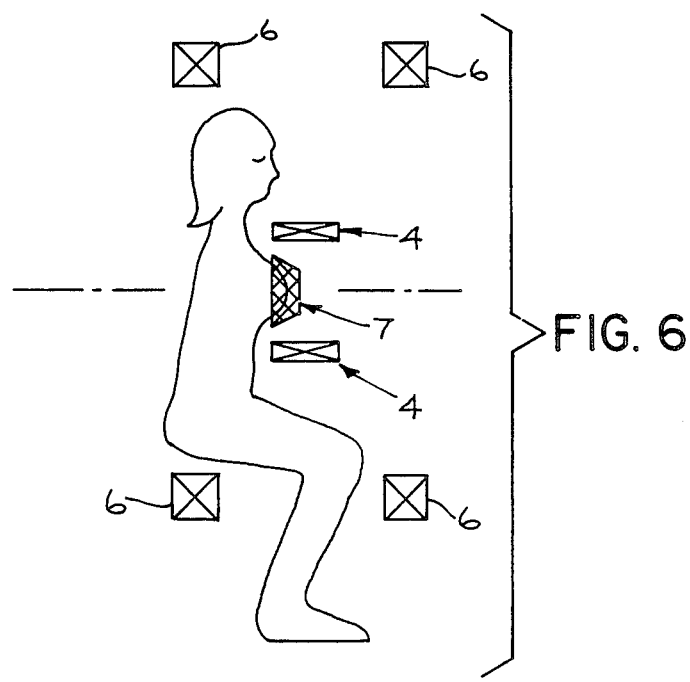
FIGS. 6 and 7 show a principle view of a second and a third NMR examination apparatus, adapted particularly for the examination of a female breast, FIG. 8 show in principle view a possibility of changing the diameter of RF coil of the invention, FIGS. 9a and 9b still another way of providing an RF coil with a continuous transfer line.

FIG. 6 shows an RF coil arrangement of the invention as applied to imaging of a female breast. A Helmholz type of magnetic coil set 6 is used to generate a homogeneous basic magnetic field. The patient is sitting inside the magnet and an RF coil set 7 of the invention wound on the surface of a frusto-conical body serves as a receiver and transmitter.

Figure 7:
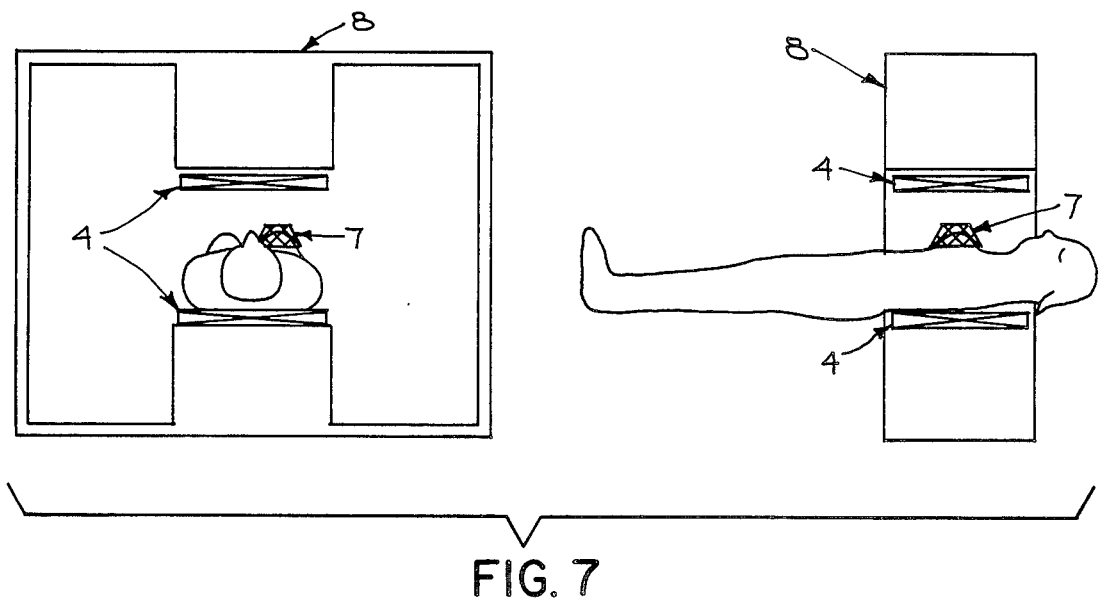

FIG. 7 discloses another embodiment for imaging a female breast. In this case, a basic magnetic field is generated by means of a Helmholz type of iron magnet 8. The rest of the system of FIGS. 6 and 7 can be effected e.g. as shown in FIG. 5.

Figure 8:
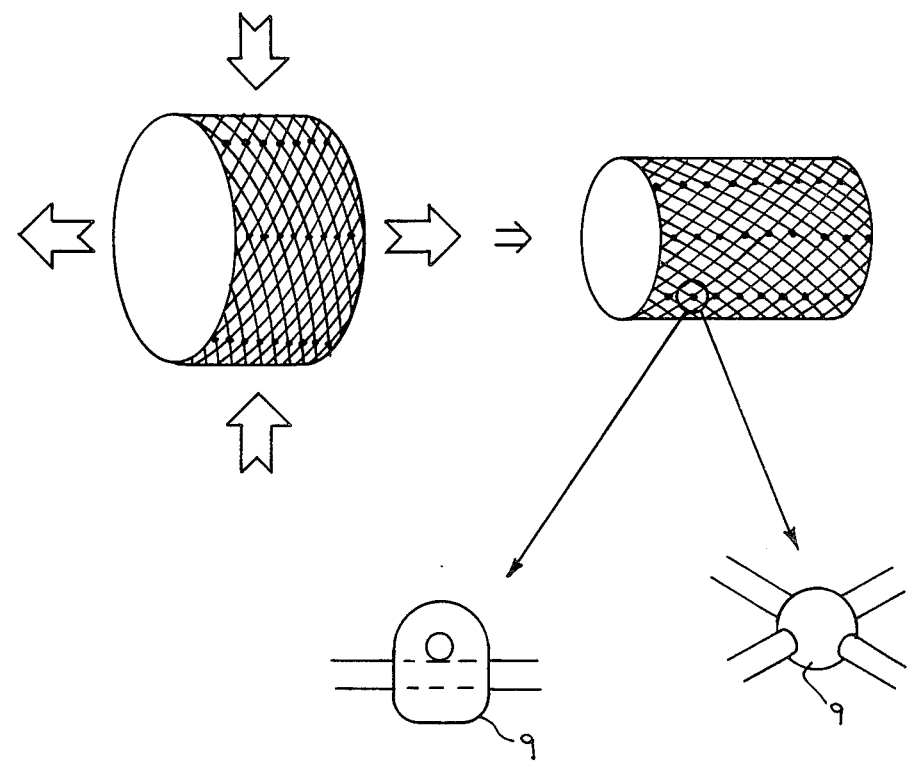

FIG. 8 shows a coil arrangement of the invention for adjusting the dimensions of a coil set. This is effected by reinforcing a coil set with flexible, e.g. rubber bindings 9 into a unitary fabric, which remains intact without any separate body member and which in axial direction can be compressed or extended. Thus, the coil respectively increases or decreases in size in radial direction. Adjusting the dimensions of an RF coil to comply with a target is advantageous since the connection of a coil set to a signal source will be the better the smaller the coil set is, because the signal-to-noise ratio is proportional to the relationship between the square of circuit K and inductance L, said relationship in turn being inversely proportional to the volume of a coil (e.g. r$^3$), or $$\frac{P_s}{P_n} \propto \frac{K^2}{L} \approx \frac{1/r^2}{r} = \frac{1}{r^3}$$

Figure 9A:
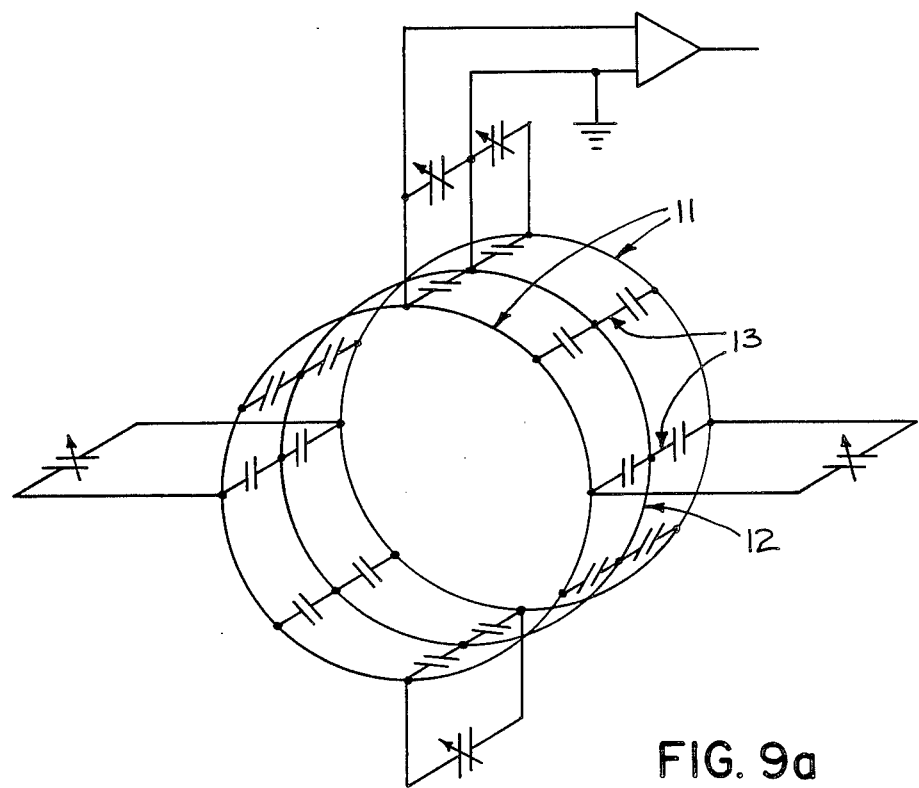
Figure 9B:
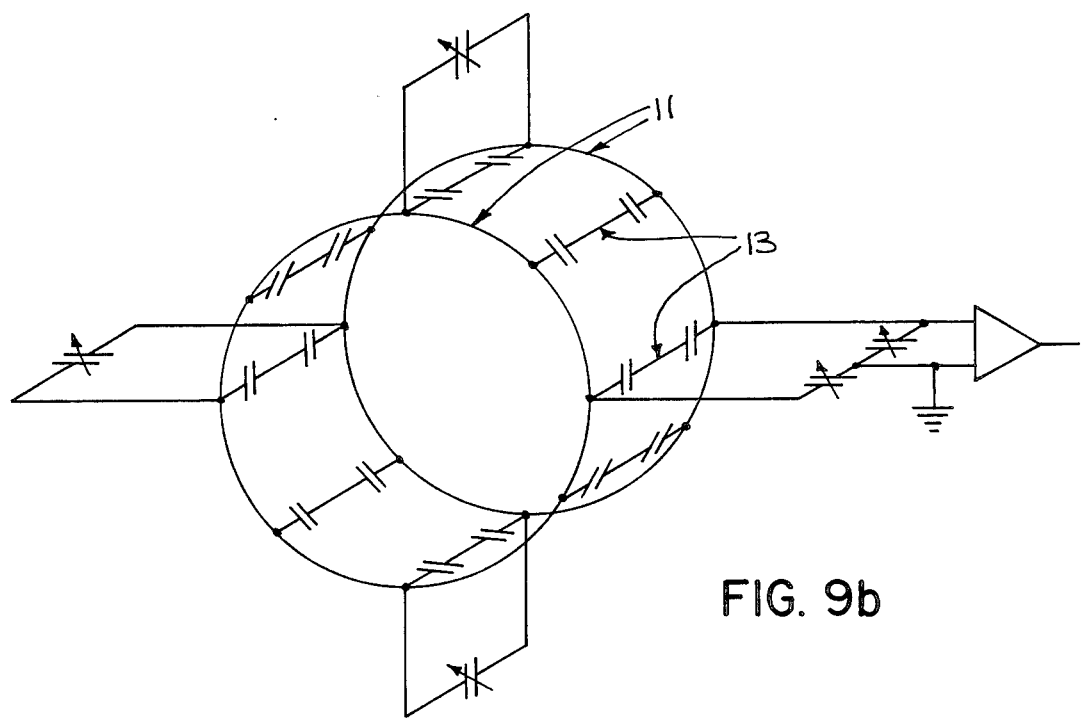

FIG. 9a discloses still another way of providing a continuous transfer line RF coil. A surface of revolution, in this case the surface of a cylinder is provided with rods 13, capacitively connected to two loops 11 which actually make up a transfer line. A loop 12 provides an earth wire connecting the rods. In FIG. 9b, the earth loop has been omitted. The figures also show the necessary coupling capacitors and a preamplifier.

The invention is not limited to the above embodiments but a plurality of modifications of the invention are conceivable within the scope of the annexed claims.

I claim:

1. A radio frequency coil arrangement for an NMR apparatus for examining a target, said apparatus having a homogeneous basic magnetic field, said coil arrangement receiving the target and being coupleable to an rf generator for transmitting an rf signal and to an rf receiver for receiving and detecting an NMR signal generated in the target, said coil arrangement comprising:

a coil form having a central axis of revolution, first and second circular ends spaced along said central axis, and a surface of revolution extending between said spaced coil form ends, said coil form being positionable in the NMR apparatus with said axis of revolution lying parallel to the basic magnetic field;

a coil formed of rf transmission line applied to said surface of revolution, said coil having a plurality of turns, each of said turns comprising a pair of series connected segments, one of said segments extending from said first coil form end to said second coil form end, the other of said segments extending from said second coil form end to said first coil form end, said segments of each turn lying at angles to each other and being skewed with respect to the axis of revolution, the turns of said coil being circumferentially spaced about said surface of revolution with the corresponding segments of the turns lying generally parallel to each other, all said segments lying on said coil form and forming active elements of said coil, said transmission line having ends, said transmission line ends being coupled together; and means for energizing said coil to produce a rotating rf field by utilizing phase differences created in said transmission line, said rotating rf field lying at an angle to the basic magnetic field.

2. A radio frequency coil arrangement as set forth in claim 1 further including an amplifier coupled at a selected frequency with said coil for amplifying the voltage of a received rf field rotating in a single direction.

3. A radio frequency coil arrangement as set forth in claim 2 further including a plurality of amplifiers coupled at different points to said transmission line, means for providing selected phase differences to the output signals of said amplifiers, and means for summing the phase differing signals for providing a final output signal containing the voltage induced by a received rf field rotating in a single direction.

4. A radio frequency coil arrangement as set forth in claim 1 further including an rf transmitter having a predetermined frequency, said transmitter being so coupled to said coil arrangement as to induce an rf field rotating in a single direction.

5. A radio frequency coil arrangement as set forth in claim 4 further including a plurality of rf transmitters coupled at different points to said transmission line, and means for providing phase differences in the output signals of said rf transmitters such that the summed rf field induced by said signals rotates in a single direction.

6. A radio frequency coil arrangement as set forth in claim 1 wherein each turn occupies a distance of approximately 2π on said surface of revolution.

7. A radio frequency coil arrangement as set forth in claim 6 wherein said surface of revolution is formed as a cylinder.

8. A radio frequency coil arrangement as set forth in claim 6 wherein said surface of revolution is formed as a truncated cone.

9. A radio frequency coil arrangement as set forth in claim 6 wherein said surface of revolution is spherically formed.

10. A radio frequency coil arrangement as set forth in claim 1 wherein said coil form is deformable for altering the dimensions of said coil, wherein segments of one coil turn overlap segments of other coil turns, said coil arrangement including flexible joinder members interposed between said segments at locations where said segments overlap for permitting deformation of said coil form while maintaining said coil as an integral structure.

11. An rf coil arrangement for an NMR apparatus for examining a target, said apparatus having a homogeneous basic magnetic field, said coil arrangement receiving the target and being coupleable to an rf generator for transmitting an rf signal and to an rf receiver for receiving an detecting an NMR signal generated in the target, said coil arrangement comprising:

a coil form having a central axis and a surface of revolution, said coil form being positionable in the NMR apparatus with said axis of revolution lying parallel to the basic magnetic field; and a coil formed of rf transmission line applied to said surface of revolution, said coil comprising segments of transmission line applied to said surface of revolution substantially parallel to said axis of revolution, the said segments being capacitively connected in parallel at each of their ends, said coil having a ring circumferentally arranged on the surface of revolution intermediate the ends of said segments for electrically connecting the midsections of said transmission line segments to provide ground potential to said coil; and means for energizing said coil to produce a rotating rf field by utilizing phase differences created in said transmission line, said rotating rf field lying at an angle to the basic magnetic field.

* * * * *